United States Patent [19]

Galani et al.

[11] Patent Number: 4,616,191

[45] Date of Patent: Oct. 7, 1986

[54] MULTIFREQUENCY MICROWAVE SOURCE

[75] Inventors: Zvi Galani, Bedford; Richard A. Campbell, Concord, both of Mass.

[73] Assignee: Raytheon Company, Lexington, Mass.

[21] Appl. No.: 511,067

[22] Filed: Jul. 5, 1983

[51] Int. Cl.⁴ .................... H03L 7/12; H03B 23/00
[52] U.S. Cl. ............................. 331/4; 455/119; 331/17; 331/178; 342/201; 342/103
[58] Field of Search ............. 343/7 PL, 17.2 R, 17.5, 343/5 AF; 331/19, 17, 25, 177 R, 4, 178; 455/101, 119

[56] References Cited

U.S. PATENT DOCUMENTS 3,293,559 12/1966 Howard et al. .................. 331/19
3,641,434 2/1972 Yates et al. ...................... 331/19 X
4,020,419 4/1977 Caspari et al. .................. 331/19 X Primary Examiner—T. H. Tubbesing
Assistant Examiner—Gilberto Barrón, Jr.
Attorney, Agent, or Firm—Philip J. McFarland; Richard M. Sharkansky

[57] ABSTRACT

A frequency-agile source of microwave frequency signals is shown to include: a voltage-controlled oscillator operating within a band of microwave frequencies; a crystal-controlled oscillator operating at a frequency lower than the band of microwave frequencies and producing harmonics within such band; a phase detector having samples of the signals out of the crystal-controlled oscillator and the voltage-controlled oscillator applied as input signals; and a shaping amplifier receiving the output signal of the phase detector to provide a control signal related to the phase difference between the signal out of the voltage-controlled oscillator and the harmonic of the crystal-controlled oscillator nearest to the frequency of the voltage-controlled oscillator.

2 Claims, 3 Drawing Figures

MULTIFREQUENCY MICROWAVE SOURCE

BACKGROUND OF THE INVENTION

This invention pertains generally to microwave signal sources and more particularly to a frequency-agile microwave signal source that is phase-locked to a selected one of the harmonics of a reference signal source.

As is known in the art, microwave signal sources are necessary elements in the transmitter and the receiver sections of a radar system. In many applications, it is highly desirable, if not essential, that such sources be frequency-agile, meaning that their frequencies may be changed during operation. One known way of providing such agility is to phase-lock a voltage-controlled oscillator (VCO) operating in the desired microwave band to a selected one of a number of harmonics of a reference signal source operating at a relatively low frequency. It will be evident that, to achieve frequency agility, there must be at least two harmonics (in practice there are far more) of the reference signal generator in the desired microwave band and that means must be provided to select the proper harmonic at any given time.

A conventional approach is to use a crystal-controlled oscillator operating, say, in the range of 40 megahertz, with appropriate frequency multipliers to produce harmonics in the desired microwave range, say 5 gigahertz. The VCO then is phase-locked to a selected one of the harmonics, the selected one being changed as required to achieve frequency agility. The circuitry for controlling the selection of any particular harmonic is, however, rather complicated with stringent limits on accuracy so it is difficult in practice to implement.

SUMMARY OF THE INVENTION

With the foregoing background of the invention in mind it is a primary object of this invention to provide a frequency-agile microwave source wherein a VCO operating within a band of microwave frequencies is phase-locked to any one of several harmonics of a reference signal source without any need to preselect a particular harmonic of such reference signal.

It is another object of this invention to provide a frequency-agile microwave source wherein the accuracy of the requisite VCO need be controlled only within relatively wide limits.

The foregoing and other objects of this invention are generally attained by providing a frequency-agile microwave source wherein a VCO operating within a band of microwave frequencies is phase-locked, via a sampling phase detector, to a reference oscillator operating at a fundamental frequency below microwave frequencies and a second sampling phase detector is provided to supply a lock indication signal to the phase-lock loop control circuitry.

BRIEF DESCRIPTION OF THE DRAWINGS

The foregoing features of this invention, as well as the invention itself, may be more fully understood from the following detailed description read together with the accompanying drawings, wherein.

DESCRIPTION OF THE PREFERRED EMBODIMENT

Before proceeding with a detailed description of the contemplated frequency-agile microwave source it should be noted that, for the sake of drawing clarity, only those elements required for an understanding of the operation of the invention are shown. Thus, for example, components such as isolators have not been shown although components of such nature would be included in an operational microwave source.

Figure 1:
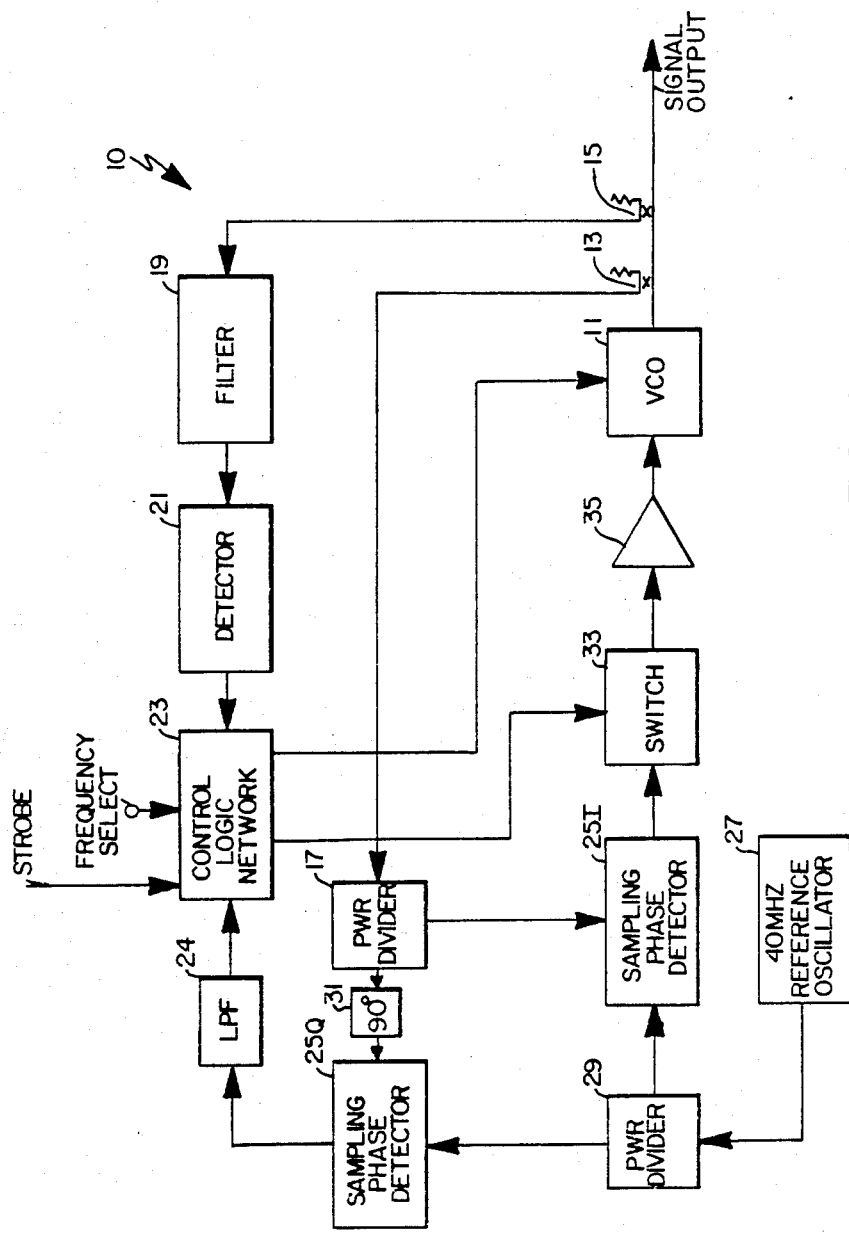
FIG. 1 is a simplified block diagram of a frequency-agile microwave source according to this invention.

Referring now to FIG. 1, a frequency-agile microwave source 10 according to this invention is shown to include a microwave, say, a C-band voltage-controlled oscillator (VCO 11). The output signal from VCO 11 is shown to be coupled, via directional couplers 13, 15, to, respectively, a power divider 17 and a filter 19. The filter 19 is a narrow-band device tuned to the lowest frequency desired out of the VCO 11. The output signal from the filter 19 is detected in a detector 21 to provide a first input signal to a control logic network 23 for reasons to be explained in detail hereinbelow.

The power divider 17 is effective to pass the C-band signal out of the directional coupler 13 to a sampling phase detector 25I, and, via a 90° phase shifter, to a sampling phase detector 25Q. The sampling phase detectors 25I, 25Q will be explained in detail hereinbelow with reference to FIG. 3. Suffice it to say here that the sampling phase detectors 25I, 25Q are operative to allow the reference frequency out of a reference oscillator 27 to be a sub-harmonic of the operating frequency of the VCO 11. The reference signals to the sampling phase detectors 25I, 25Q are taken from the reference oscillator 27 (here a crystal-controlled oscillator operating at 40 MHz) via a power divider 29. The output signal from the sampling phase detector 25I is passed, via a switch 33 and a shaping amplifier 35, as a control signal to the VCO 11. It will now be appreciated by those of skill in the art that the combination of the coupler 13, the power divider 17, the sampling phase detector 25I, the switch 33 and the shaping amplifier 35 is effective to form a phase-lock loop (not numbered) operative to lock the frequency of the VCO 11 to a harmonic of the 40 MHz reference oscillator 27. It will also be appreciated that when the phase-lock loop (not numbered) is locked, the output signal from the sampling phase detector 25I will be at, or near, a zero crossing, and, conversely, the output signal from the sampling phase detector 25Q (which is also provided as an input signal to the control logic network 23) will be at a maximum.

Figure 2:
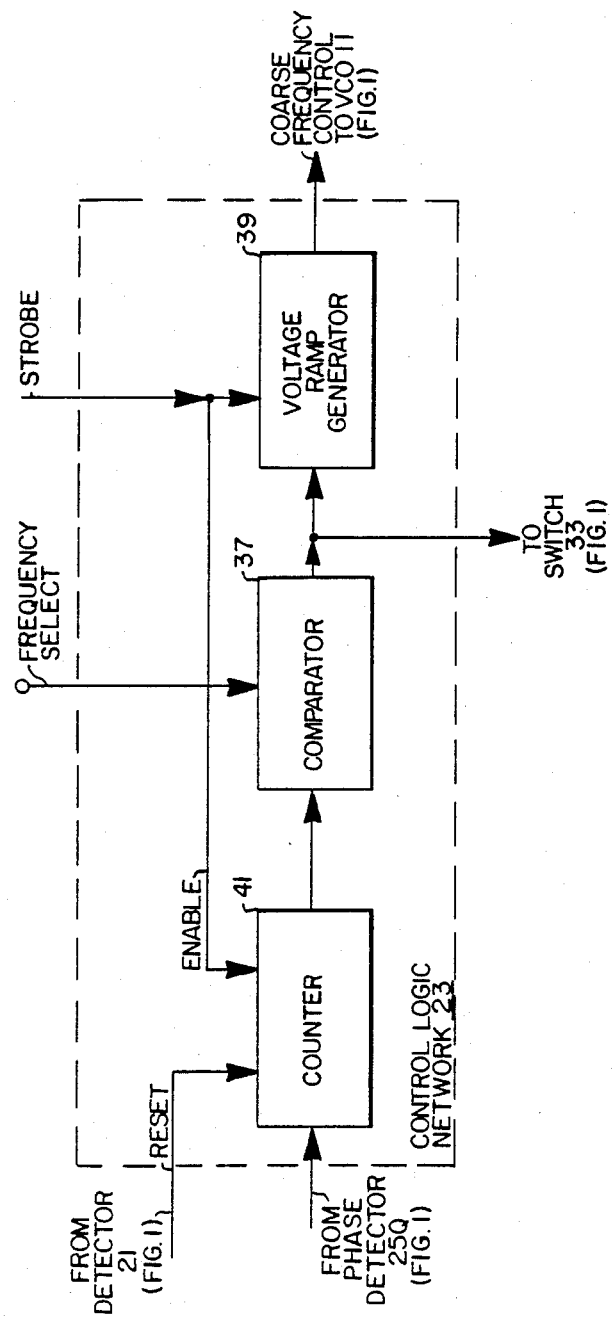
FIG. 2 is a simplified block diagram of the control logic network of FIG. 1.

Referring now to both FIGS. 1 and 2, the operation of the frequency agile microwave source 10 will be described. Thus, the control logic network 23 is shown to receive an externally applied FREQUENCY COMMAND signal that is indicative of the desired operating frequency of the VCO 11 and a STROBE signal that is effective to tune the VCO to the desired frequency. The FREQUENCY COMMAND signal, which here may simply be a digital word, is applied to a comparator 37 while the STROBE signal is applied to both a voltage ramp generator 39 and, as an ENABLE signal, to a counter 41. Upon receipt of a STROBE signal, the voltage ramp generator 39 produces a coarse tuning voltage for the VCO 11 that is effective to drive the frequency of the VCO 11 below the lower limit of the operating microwave frequency band. The coarse frequency control signal from the voltage ramp generator 39 is then effective to sweep the VCO 11 up in frequency until an output signal from the detector 21 is received by the control logic network 23 thereby indicating that the VCO 11 has been tuned to the lower limit of the band of operating microwave frequencies. Within the control logic network the output signal from the detector 21 is provided as a RESET signal to the counter 41. The second input to the latter is the output signal from the sampling phase detector 25Q obtained via the low pass filter 24. The output signal from the latter goes through successive output voltage maxima as the frequency of the VCO 11 is swept through the various harmonics of the 40 MHz reference signal. Each one of such voltage maxima increments the counter 41 so that, when that count is equal to the frequency command word impressed on the comparator 37, the comparator 37 will provide a logic level 1 output to the voltage ramp generator 39 to terminate the sweep. The logic level 1 output from the comparator 37 is also provided as a control signal to the switch 33 to cause the latter to close, thereby closing the phase-lock loop (not numbered) and causing it to lock to the desired harmonic of the 40 MHz reference signal. The acquisition of lock would be indicated by the presence of a pure D.C. output signal from the sampling phase detector 25Q.

It should be noted that there will be a sufficient time delay between the receipt of an output signal from the detector 21 and the first voltage maximum from the low pass filter 24 to allow the counter 41 to detect such first voltage maximum and terminate the sweep if that first count corresponds to the FREQUENCY COMMAND word stored in the comparator 37. It will be appreciated that the time taken for the just-described frequency search is dependent upon the counting rate of the counter 41 and the time constant of the phase-lock loop (not numbered). Typically, a counting interval of less than a microsecond and a loop bandwith in excess of one megahertz are very reasonable, so that a search rate in the order of a microsecond per megahertz is reasonable.

The accuracy of the frequency-agile source 10 is determined primarily by the characteristics of the filter 19. That is to say, for proper operation of the frequency agile source 10, the low frequency roll-off of the filter 19 must be sharp and stable in frequency to a fraction of the 40 MHz reference frequency. Thereafter, the only other requirement to insure accuracy of the frequency agile source is that the slope of the coarse frequency control voltage applied to the VCO 11 be sufficiently low to allow the appropriate gates within the control logic network 23 to operate before the frequency of the VCO 11 sweeps into the pull-in range of the next highest harmonic of the 40 MHz reference signal.

Figure 3:
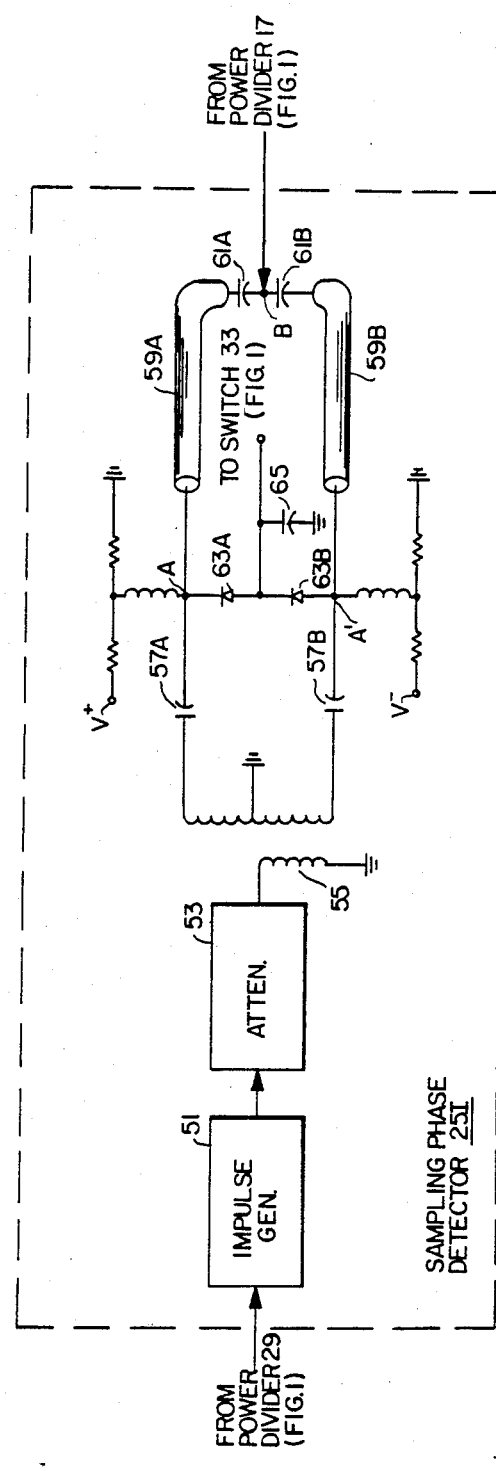
FIG. 3 is a simplified schematic diagram of the sampling phase detectors of FIG. 1.

Referring now to FIG. 3, an exemplary one of the sampling phase detectors, here phase detector 25I, is shown to include an impulse generator 51, the input signal to which is the 40 MHz reference signal from the power divider 29. Within the impulse generator 51 a step recovery diode (not shown) triggered by the 40 MHz reference signal is utilized to generate sampling pulses. The sampling pulses from the impulse generator 51 are attenuated by an attenuator 53 prior to being passed to a balun 55.

Digressing briefly here now for a moment, it will be appreciated by those of skill in the art that sampling theory states that the sampling rate must be equal to or greater than twice the highest frequency in the spectrum of the signal to be sampled. In this case the highest frequency is the upper limit of the noise bandwidth to be degenerated by the loop. Also, in order to insure proper operation as a phase detector, the pulsewidth of the sampling pulses must be equal to, or less than, one-half the period of the highest frequency to be sampled, so that sampling of that signal will occur on both sides of a zero crossing point. The latter requirement means that where the highest frequency output signal from the VCO 11 (FIG. 1) is a C-band signal of, say, 5 GHz, the pulsewidth of the sampling signals must be equal to, or less than, 100 picoseconds. As the average pulsewidth of the pulses formed by the impulse generator 51 is on the order to 200 to 250 picoseconds (due primarily to the response time of the step recovery diodes), a pulse forming/shaping network is required to develop 100 picosecond pulses.

The balun 55 is effective to provide equal amplitude, but opposite polarity, signals to the arms of a balanced pulse-shaping network (not numbered). Those pulses travel, via D.C. blocking capacitors 57A, 57B, transmission line segments 59A, 59B, and capacitors 61A, 61B, to a point B whence such pulses are reflected back. It will be appreciated that, upon reflection from the virtual short circuit at point B, the pulses will undergo an instantaneous 180° phase reversal. The electrical length of the transmission line segments 59A, 59B is designed to provide a 50 picosecond delay and, consequently, when the leading edges of the reflected pulses appear back at points A and A', the reflected portion of the pulse cancels the incoming 200 to 250 picosecond pulse ultimately to produce a 100 picosecond pulse at points A and A'. Such 100 picosecond pulses are effective to gate ON Schottky diodes 63A, 63B, which are normally biased OFF by conventional bias control networks (not numbered). The latter include voltage dividers and R.F. chokes (neither of which are numbered). When the Schottky diodes 63A, 63B are ON, 100 picosecond wide samples of the C-band signal cause a capacitor 65 to charge. The output from the latter is applied as the control voltage to the VCO 11 (FIG. 1).

It should now be appreciated by those of skill in the art that the just-described sampling process causes the input C-band spectrum from the power divider 17 (FIG. 1) to be repeated at intervals equal to the sampling frequency. As the frequency of the C-band signal out of the VCO 11 approaches a harmonic of the reference signal, an A.C. output voltage first is produced by the sampling phase detector 25I at the difference frequency. When the C-band signal out of the VCO is equal to a harmonic of the reference signal, a D.C. voltage (proportional to the cosine of the phase difference between the C-band signal and a corresponding harmonic of the reference signal) is produced.

Having described a preferred embodiment of this invention, it will now be apparent to one of skill in the art that many changes may be made without departing from our inventive concepts. For example, the frequencies at which the oscillators operate and the characteristics of the voltage ramp generator may be varied to adjust the band of microwave frequencies (and the number of harmonics within such adjusted band) over which the VCO is operative as described. It is felt, therefore, that this invention should not be restricted to its disclosed embodiment, but rather should be limited only by the spirit and scope of the appended claims.

What is claimed is:

1. A frequency-agile source of microwave frequency signals, such source comprising:
   (a) a voltage-controlled oscillator for producing a microwave frequency signal anywhere within a predetermined band of such signals in response to applied control signals;
   (b) a crystal-controlled oscillator operating at a frequency lower than the predetermined band of microwave frequency signals, such crystal-controlled oscillator also producing equally spaced harmonics within the predetermined band of microwave signals;
   (c) first means for generating a first control signal operative, per se, to sweep the frequency of the voltage-controlled oscillator through the predetermined band of microwave frequencies, starting from a predetermined side of such band;
   (d) second means, responsive to the signal out of the crystal-controlled oscillator, for simultaneously producing a positive-going and a negative-going sampling signal each time a positive-going zero crossover occurs in such signal, the time duration of each such sampling signal being equal to, or less than, the half-period of the highest microwave frequency signal out of the voltage-controlled oscillator; diode means, responsive to each positive-going and negative-going sampling pulse, for rectifying the then-existing microwave frequency signal to produce an indicating signal having an amplitude and polarity corresponding to the difference in phase between the then existing microwave frequency signal and the nearest one of the harmonics of the crystal-controlled oscillator; and means for integrating the indicating signal to produce a second control signal, such control signal being effective to change the frequency of the voltage-controlled oscillator, ultimately to null the indicating signal; and
   (e) control means, responsive to the indicating signal and to a predetermined frequency signal indicative of the number of harmonics between a desired harmonic and the harmonic nearest to the predetermined side of the band of microwave frequencies, for producing a third control signal upon the attainment of equality between the number of indicating signals and the predetermined frequency command signal, such third control signal being effective to inhibit further operation of the first means and to connect the second control signal to the voltage-controlled oscillator to phase-lock the voltage-controlled oscillator to the desired harmonic.

2. The frequency-agile source as in claim 1 having additionally third means similar to the second means, but having in addition a phase shifter disposed to shift the phase of the signal from the crystal-controlled oscillator by 90°, thereby ultimately to produce an indicating signal, such signal having a maximum when the second control signal is nulled.

* * * * *